United States Patent [19]

Shinagawa et al.

[11] Patent Number: 4,896,300
[45] Date of Patent: * Jan. 23, 1990

[54] MICROPROCESSOR INCLUDING A MICROPROGRAM ROM HAVING A DYNAMIC LEVEL DETECTING MEANS FOR DETECTING A LEVEL OF A WORD LINE

[75] Inventors: Yutaka Shinagawa, Koganei; Shigeru Shimada, Hoya, both of Japan

[73] Assignees: Hitachi, Ltd.; Hitachi Microcomputer Engineering, Ltd., Tokyo, Japan

[*] Notice: The portion of the term of this patent subsequent to Jan. 12, 2005 has been disclaimed.

[21] Appl. No.: 126,258

[22] Filed: Nov. 25, 1987

Related U.S. Application Data

[62] Division of Ser. No. 852,316, Apr. 15, 1986, Pat. No. 4,719,603.

[30] Foreign Application Priority Data

Apr. 15, 1985 [JP] Japan .................................. 60-78364

[51] Int. Cl.$^4$ ...................... G11C 7/00; G11C 11/40; G11C 8/00
[52] U.S. Cl. ............................... 365/204; 365/230.01; 365/230.06; 365/190; 365/189.01
[58] Field of Search ............. 365/230.01, 204, 230.06, 365/189.01, 189.11, 190, 233.5

[56] References Cited

U.S. PATENT DOCUMENTS 4,719,603 1/1988 Shinagawa et al. ................ 365/230

Primary Examiner—Stuart N. Hecker
Assistant Examiner—Alyssa H. Bowler
Attorney, Agent, or Firm—Antonelli, Terry & Wands

[57] ABSTRACT

A semiconductor memory includes a word line driving circuit whose output terminal is coupled to one end of each word line of a memory array, and also an auxiliary driving circuit which drives the other end of the word line upon receiving a selection signal transmitted to the other end of this word line. The auxiliary driving circuit comprises a level detector circuit which is dynamically driven by a timing signal, and a driving element which is driven by an output of the level detector circuit to drive the other end of the word line. When the word line is to be reset, the output of the level detector circuit is set at a level which brings the driving element into an "off" state. The auxiliary driving circuit of this arrangement permits the other end of the word line to change to a selection level quickly and to be reset quickly.

9 Claims, 2 Drawing Sheets

MICROPROCESSOR INCLUDING A MICROPROGRAM ROM HAVING A DYNAMIC LEVEL DETECTING MEANS FOR DETECTING A LEVEL OF A WORD LINE

This is a division of Ser. No. 852,316, filed 4/15/86, now U.S. Pat. No. 4,719,603.

BACKGROUND OF THE INVENTION

This invention relates to a semiconductor memory, and more particularly to a technique which is effective when utilized for, e.g., a word line driving circuit in a semiconductor memory which is constructed of MOSFETs (insulated gate type field effect transistors).

As to a word line driving circuit in a semiconductor memory constructed of MOSFETs, there have been proposed, for example, circuit forms as shown in FIGS. 4 and 5 (refer to the official gazette of Japanese Patent Application Laid-Open No. 55-150189).

The circuit in FIG. 4 is such that a CMOS (complementary MOS) inverter circuit IV for detecting the level of a word line WL is connected to the remote end of the word line WL, and that a MOSFET Q23 is interposed between the word line WL and a power source voltage $V_{cc}$. In this circuit, when the potential of the word line WL to be selected has exceeded the logic threshold voltage of the CMOS inverter circuit IV, the output of the CMOS inverter circuit IV is changed to a low level. The P-channel MOSFET Q23 is brought into the "on" state by the low level output of the CMOS inverter circuit IV. As a result, the period of time in which the word line WL (which typically is made of comparatively high resistance polycrystalline silicon) reaches the final arrival level ($V_{cc}$) thereof is shortened.

In the circuit of the form shown in FIG. 4, however, when the potential of the selected word line WL is to be lowered to an unselected level (e.g., ground potential), the MOSFET Q23 is held in the "on" state by the output of the CMOS inverter circuit IV. Therefore, a through current flows to the word line WL via the MOSFET Q23, and the potential of the word line is difficult to reduce.

On the other hand, in the circuit shown in FIG. 5, a P-channel MOSFET Q24 and an N-channel MOSFET Q25 for resetting are inserted in series with a MOSFET Q23 and respectively between the MOSFET Q23 and a power source voltage $V_{cc}$ and between a word line WL and a ground potential point. These MOSFETs Q24 and Q25 are on/off-controlled in synchronism with a word line driving circuit WD. That is, when the word line WL is to be selected, a reset signal P is set to a low level, whereby the MOSFET Q24 is brought into the "on" state, and the MOSFET Q25 into the "off" state. Thus, the illustrated circuit performs the same operation as that of the circuit of FIG. 4 in the selecting mode. When the word line WL is to be set to an unselected level, the reset signal P is changed to a high level. At this time, the MOSFET Q24 is brought into the "off" state, and the MOSFET Q25 is brought into the "on" state, so that the selected word line is quickly changed to the low level. Thus, the problem noted above for the FIG. 4 circuit does not occur.

The circuit of the form in FIG. 5, however, has a large number of elements. Moreover, unless the element size of the MOSFETs Q23 and Q24 is enlarged as compared with that of the MOSFET Q23 in the circuit form of FIG. 4 so as to lower the combined impedance of these MOSFETs connected in series, a rapid rise of the level of the word line is difficult to achieve.

In this regard, in an IC memory, it reduces the occupation area of a memory array to form word lines at the narrowest possible intervals Accordingly, when it is inevitable to enlarge the sizes of the elements constituting the circuit or to increase the number of the constituent elements as described above, it becomes difficult to arrange circuits in conformity with the word line intervals, especially in an IC memory which is composed of one-element type memory cells. As a result, chip size is enlarged unnecessarily. The problems as described above have been revealed by the inventors' studies regarding the circuit arrangements shown in FIGS. 4 and 5.

SUMMARY OF THE INVENTION

An object of this invention is to provide a semiconductor memory whose power consumption is lowered and whose access time is shortened.

The aforementioned and other objects and novel features of this invention will become apparent from the description of this specification and the accompanying drawings.

A representative embodiment of the present invention will be briefly summarized below.

The circuit of the present invention is provided with a level detector circuit for the selected line of a memory array. This level detector is constructed of a first MOSFET Q4 of a first conductivity type which is brought into the on/off state in accordance with the potential of the selected line, a second MOSFET Q5 of the first conductivity type which is interposed between the source of the first MOSFET Q4 and the ground potential point of the circuitry, and a third MOSFET Q6 of a second conductivity type which is interposed between the drain of the first MOSFET Q4 and the terminal of a power source voltage. The second and third MOSFETs Q5 and Q6 both receive a timing signal substantially synchronous with the selection timing of the selected line Also, a fourth MOSFET Q7 of the second conductivity type and/or a fifth MOSFET Q8 of the first conductivity type are/is interposed between the selected line and the terminal of the power source voltage and/or between the selected line and the ground potential line of the circuitry. The fourth MOSFET Q7 and the fifth MOSFET Q8 have their conductances controlled by the drain and source outputs of the first MOSFET Q4 of the level detector circuit, respectively.

PREFERABLE EMBODIMENTS

Embodiment 1

Figure 1:
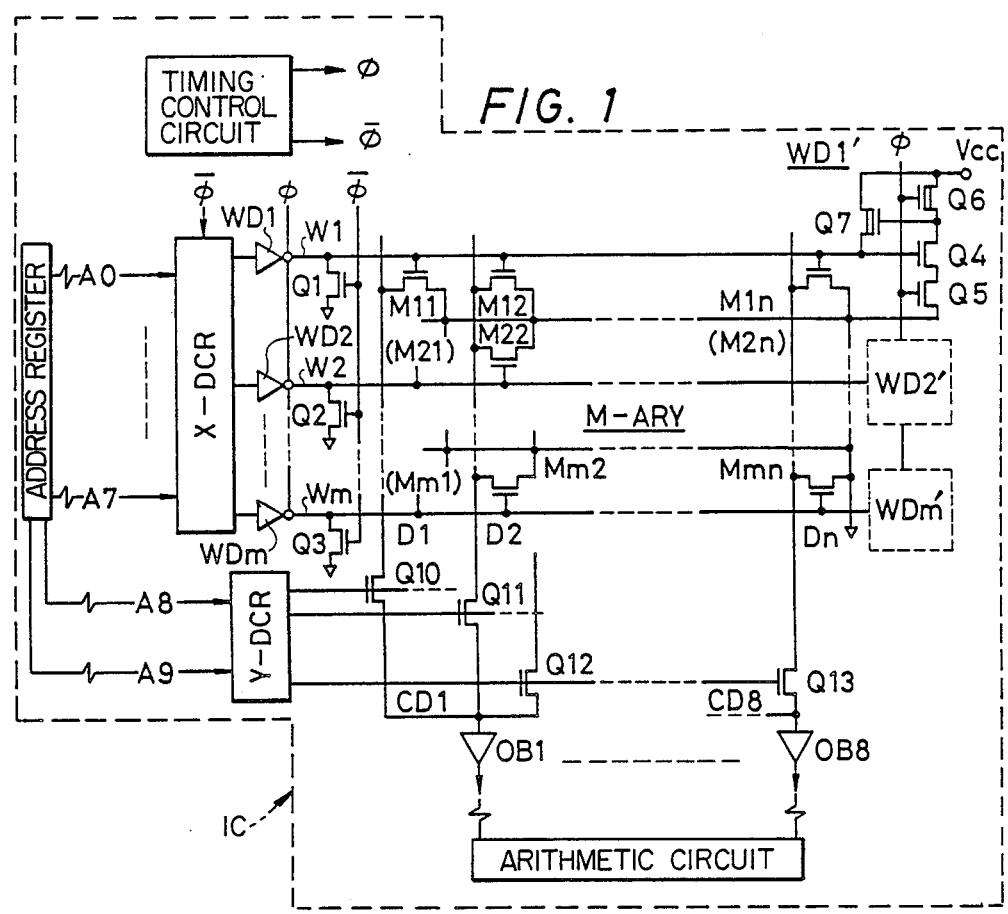
FIG. 1 is a circuit diagram showing an embodiment of a mask type ROM according to this invention.

FIG. 1 is a circuit diagram showing an embodiment of a mask type ROM (read only memory) to which this invention is applied. Though not especially restricted, the ROM of this embodiment is utilized as a microprogram ROM in a microprocessor. Therefore, the ROM of this embodiment is formed on a single semiconductor substrate by the known manufacturing techniques of complementary MOS integrated circuits, along with various registers, arithmetic circuits, timing control circuits, etc., not shown, which constitute an integrated circuit. Such a microprogram ROM needs to respond to instructions in the microprocessor and deliver corresponding control signals as quickly as possible. By way of example, the microprogram ROM is desired to be accessible at a high frequency such as 10 MHz.

The ROM of the embodiment to be now described has the features that a very fast operation is permitted and that the power consumption is low.

Indicated by a circuit symbol M-ARY in FIG. 1 is a memory array, which includes a plurality of memory cells M11 -Mmn arranged in a matrix shape. The respective memory cells are arranged at the intersection points between a plurality of word lines W1 through Wm extended in a row direction and a plurality of data lines D1 through Dn extended in a column direction.

Each of the memory cells M11 - Mmn constituting the memory array M-ARY can be, in effect, regarded as being made up of a single MOSFET. Stored information items "1" and "0" in each memory cell correspond respectively to the conduction and non-conduction thereof at the time at which the memory cell is selected. In this embodiment, the stored information items "1" and "0" correspond respectively to the state in which the MOSFET is connected between the word line and the data line and the state in which it is not connected, though no restriction is especially intended.

In FIG. 1, the memory cells such as those M11 and M12 depicted with circuit symbols signify that the drains of the respective constituent storage elements are connected to the corresponding data lines D1 and D2. In contrast, the memory cells such as those (M21) and (M2n) without the depiction of circuit symbols signify that the respective constituent storage elements are substantially unconnected to the data lines D1 and Dn to correspond thereto In this embodiment, though no restriction is especially intended, each MOSFET to construct the memory cell is of the N-channel type, and the gate electrode thereof is made of an electrically-conductive polycrystalline silicon layer which is formed unitarily with the corresponding word line. That is, the MOSFETs are formed by the so-called self-alignment technique in which the gate electrodes made of the polycrystalline silicon layer are used as a kind of impurity introducing mask. The plurality of electrically-conductive polycrystalline silicon layers used as the word lines and the gate electrodes are extended in parallel with one another on the semiconductor substrate The data lines and ground lines in the memory array are made of conductor layers, for example, evaporated aluminum layers which are formed on the semiconductor substrate through an inter-layer insulator film, and they are extended in a direction orthogonal to the extending direction of the polycyrstalline silicon layers used as the word lines. The conductor layers are coupled to the source regions and drain regions of the MOSFETs used as the memory cells through contact holes which are formed in the inter-layer insulator film.

Though not especially restricted, the connection and non-connection of the storage elements correspond to structures as described below.

Although the memory cell to be unconnected is put into a MOSFET structure similar to that of the memory cell to be connected, it is rendered substantially inoperable as a MOSFET in such a way that the surface of the channel forming region thereof is heavily doped with a P-type impurity by a process such as selective ion implantation. In other words, the MOSFET is held in the "off" state irrespective of the selection level of the word line. The non-connection may well be realized by the omission of the contact hole of the inter-layer insulator film, instead of the increase of the impurity concentration of the channel forming region as stated above.

The word line and the gate electrodes may well be formed of a refractory conductor layer made of, e.g., a tungsten silicide. However, the polycrystalline silicon layer and the silicide layer have comparatively high resistances An X address decoder XDCR decodes address signals A0 -A7. Though not especially restricted, the X address decoder XDCR has its operation controlled by a timing signal $\phi$ and forms a selection signal for the word line in synchronism with the timing signal $\phi$. Word line driving circuits WD1 -WDm have their operations controlled by a timing signal $\phi$ which is produced from a timing generator circuit not shown. They receive the output signals from the X address decoder XDCR and form the drive signals of the word lines W1 -Wm corresponding thereto, respectively. That is, when the timing signal $\phi$ is generated, any of the driving circuits WD1 -WDm forms the word line driving signal conforming to the output of the address decoder XDCR, in synchronism with the timing signal. Though not especially restricted, resetting MOSFETs Q1 -Q3 whose gates receive the timing signal $\phi$ are interposed between the output terminals of the respective driving circuits WD1 -WDm, in other words, the ends of the respective word lines W1 -Wm on one side and the ground potential point of the circuitry. These MOSFETs Q1 -Q3 are formed as the N-channel type.

The memory array M-ARY is divided into eight blocks, though not especially restricted The data lines in each block are respectively coupled to common data lines CD1 -CD8 through column switch MOSFETs exemplified by Q10, Q11, Q12 and Q13.

The gates of these column switch MOSFETs Q10 -Q13 are supplied with output signals from a Y address decoder YDCR which receives address signals A8 through A9. By one selection signal of the Y address decoder YDCR, one column switch MOSFET in each of the memory blocks is brought into the "on" state. That is, one data line in each memory block is selected. The selected data lines, one for each block, are connected to any of the common data lines CD1 -CD8 through the column switch MOSFETs in the "on" states. The signals of the common data lines CD1 -CD8 are delivered through data output circuits OB1 -OB8 which have the function of amplification. In this way, data consisting of 8 bits is read out in parallel by one addressing operation.

In order to enhance the access time, in other words, in order to quicken the operations of selecting the word lines W1 -Wm, this embodiment is provided with auxiliary driving circuits WD1' -WDm' each of which is constructed of MOSFETs Q4 through Q7.

As typically exemplified, the other end of the word line W1 one end of which is coupled to the output terminal of the driver circuit WD1, in other words, the remote end side of the word line W1 as viewed from the driver circuit WD1, is connected to the gate of the N-channel MOSFET Q4 which detects the level of the word line. The P-channel MOSFET Q6 is interposed between the drain of the MOSFET Q4 and the terminal of a power source voltage $V_{cc}$. In addition, the N-channel MOSFET Q5 is interposed between the source of the MOSFET Q4 and the ground potential point of the circuitry. Though no restriction is especially restricted, the gates of these MOSFETs Q5 and Q6 are supplied with the same timing signal $\phi$ as that of the word line driving circuit WD1. The drain output of the MOSFET Q4 is transmitted to the gate of the P-channel MOSFET Q7 which is interposed between the other end of the word line W1 and the terminal of the power source voltage $V_{cc}$. In the illustrated auxiliary driving circuit WD1', the MOSFETs Q4 through Q6 are regarded as constituting a level detector circuit whose operation is controlled by the timing signal $\phi$. If the timing signal $\phi$ is held at the low level, the level detector circuit is put in the non-operating state, and the output level thereof is rendered a reset level which is substantially equal to the power source voltage $V_{cc}$. The auxiliary driving MOSFET Q7 is brought into the "off" state in response to the reset level of the level detector circuit. The level detector circuit is brought into the operating state by the timing signal $\phi$ being brought to the high level. The output level of the level detector circuit in the operating state is determined by the conductive state of the MOSFET Q4.

The auxiliary driving circuits WD2' -WDm', each being constructed of MOSFETs similar to the above, are arranged at the other ends of the remaining word lines W2 -Wm.

The word line selecting operation in the circuit of this embodiment will now be described with reference to a timing chart shown in FIGS 2A and 2B.

Figure 2A:
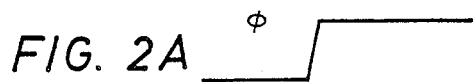
FIGS. 2A and 2B are timing chart showing an example of the operation of the embodiment of FIG. 1.
Figure 2B:
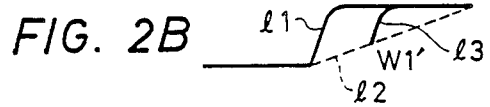

When the timing signal $\phi$ is at the low level (the timing signal $\bar{\phi}$ is at the high level) as illustrated in FIG. 2A, the address decoder XDCR is responsively held in the operating state and forms the word line selection signals for rendering one word line the selection level. Meantime, the timing signal $\phi$ is maintained at the high level, and hence, the resetting MOSFETs Q1 -Q3 are in the "on" states to hold all the word lines in the unselected states of low level.

When the timing signal $\phi$ is brought to the low level in response to the high level of the timing signal $\phi$ changed as illustrated in FIG. 2A, the address decoder XDCR is brought into the non-operating state. The respective output levels of the address decoder XDCR in the non-operating state are maintained at previous levels by output capacitances which are made up of stray capacitances existing at the corresponding output nodes.

The respective word line driving circuits WD1 through WDm are brought into the operating states in response to the timing signal $\phi$ being set at the high level, and deliver the word line selection signals corresponding to the output signals supplied from the address decoder XDCR beforehand. By way of example, if the output of the address decoder XDCR designates the selection of the word line W1, the output of the word line driving circuit WD1 is raised from the low level to the high level as indicated by a solid-line curve 11 in FIG. 2B, in synchronism with the timing signal $\phi$ being rendered to the high level. Since, at this time, the timing signal $\bar{\phi}$ is rendered the low level, all the resetting MOSFETs Q1 -Q3 are brought into the "off" states.

Here, each word line has a comparatively large stray capacitance and also a comparatively high resistance because of the large number of storage elements coupled thereto. Such a capacitance and a resistance of each word line limit the changing rate of a signal For example, when the word line W1 is to be selected, the rise to the high level becomes slow at the remote end part of the word line W1 as illustrated by a dotted line 12 in FIG. 2B.

In this embodiment, the N-channel MOSFET Q5 is brought into the "on" state and the P-channel MOSFET Q6 into the "off" state by the high level of the timing signal $\phi$. Thus, when the level of the remote end part reaches the threshold voltage of the MOSFET Q4, this MOSFET Q4 is brought into the "on" state and draws the gate potential of the MOSFET Q7 to the low level in cooperation with the MOSFET Q5 already held in the "on" state. In response to this operation, the P-channel MOSFET Q7 is brought into the "on" state so as to feed the remote end part of the word line W1 with the power source voltage $V_{cc}$. As a result, the word line W1 is charged up to the high level also from the remote end part and therefore has its level raised abruptly as indicated by a solid line 13 in FIG. 2B.

Figure 5:
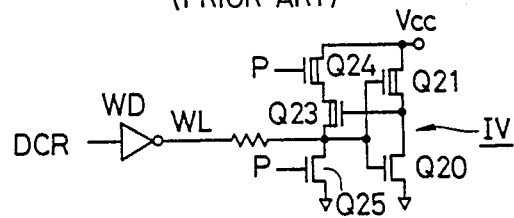
FIG. 5 diagram showing another example of a prior art driving circuit.

Since, in this way, the operation of selecting the word line can be performed at high speed, it is possible to achieve a shortened memory access time, in other words, a raised operating speed. For such auxiliary drive of the word line, the power source voltage $V_{cc}$ is transmitted to the word line directly by the single MOSFET Q7 in this embodiment. Therefore, the size of the element required for the transmission of the voltage $V_{cc}$ can be reduced to, e.g., about ½ as compared with the corresponding size of the elements in the circuit form shown in FIG. 5.

Moreover, since in this embodiment the N-channel MOSFET Q5 and the P-channel MOSFET Q6 are complementarily operated by the timing signal $\phi$, a direct current does not flow through the MOSFETs Q4 -Q6 connected in the series form, and the level detecting operation can be performed under a low power consumption.

Figure 4:
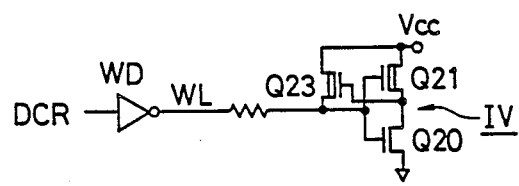
FIG. 4 is a circuit diagram showing an example of a prior art driving circuit.

When the timing signal $\phi$ is brought from the high level to the low level so as to switch the word line from the selected state into the unselected state, the P-channel MOSFET Q6 and the N-channel MOSFET Q5 are responsively brought into the "on" state and the "off" state respectively. Thus, notwithstanding that the MOSFET Q4 is held in the "on" state by the selection level of the word line, the gate voltage of the MOSFET Q7 is brought to the high level as soon as the P-channel MOSFET Q6 is brought into the "on" state. That is, the P-channel MOSFET Q7 is immediately switched into the "off" state. As a result, when the word line W1 in the selected state is switched from the high level into the unselected state of the low level by the low level output of the word line driving circuit WD1 and/or the "on" state of the resetting MOSFET Q1, the direct current which is a problem in the circuit form shown in FIG. 4 does not flow. Hence, the circuitry of the FIG. 1 arrangement has very low power consumption. Besides, the word line can be brought to the non-selection level at a comparatively high speed.

Embodiment 2

Figure 3:
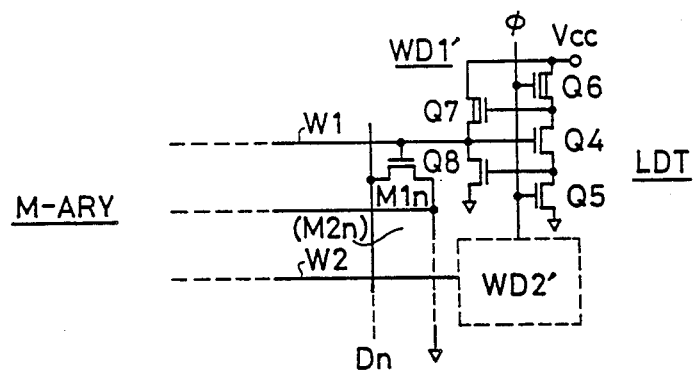
FIG. 3 is a circuit diagram showing an auxiliary driving circuit in another embodiment.

Shown in FIG. 3 is a circuit diagram of another embodiment of the auxiliary driving circuit of the present invention.

In this embodiment, in order to hasten the switching of the word line into the unselected state, an N-channel MOSFET Q8 is interposed between the remote end part of the word line and the ground potential point of the circuitry. The gate of this MOSFET Q8 is supplied with the source output of the MOSFET Q4 which performs the level detection. Since the other circuit elements are the same as those shown in FIG. 1, they shall not be explained repeatedly.

The operation of the circuit of this embodiment will now be described.

In the selected state of the word line, for example, the word line W1 in which the timing signal $\phi$ has been set at the high level, the MOSFET Q8 is held in the "off" state by the "on" state of the MOSFET Q5. When the timing signal $\phi$ is subsequently switched from the high level to the low level, the N-channel MOSFET Q5 and the P-channel MOSFET Q6 are responsively brought into the "off" state and the "on" state respectively. At this time, the word line W1 is brought from the high level to the low level by the "on" state of the resetting MOSFET (not shown) such as MOSFET Q1 in FIG. 1, but the level detecting MOSFET Q4 still remains in the "on" stage owing to the high level at the remote end part of this word line, so that the gate of the N-channel MOSFET Q8 is brought to the high level by the MOSFETs Q6 and Q4 held in the "on" states. Thus, the N-channel MOSFET Q8 is brought into the "on" state, and the word line W1 is drawn to the low level also from the remote end part. Consequently, the operation of resetting the word line can also be performed at high speed. On this occasion, although the MOSFET Q4 is brought into the "off" state by the drawing to the low level at the remote end part of the word line, the MOSFET Q8 is maintained in the "on" state because the gate capacitance, etc., thereof hold the high level in the previous state thereof.

When the timing signal $\phi$ is brought to the high level again so as to bring any word line from the unselected state into the selected state, the MOSFET Q5 is immediately brought into the "on" state, and hence, the high level held in the gate capacitance, etc., of the MOSFET Q8 is quickly drawn to the low level. As a result, this MOSFET Q8 is immediately brought into the "off" stage, so that even when the word line W1 is brought into the selected state again, the rise of the level thereof is not delayed.

According to the present invention, the following effects can be achieved:

(1) Switching MOSFETs which are complementarily operated by a signal of substantially the same timing as a selection timing are interposed between the source and drain of a MOSFET which detects the level of the remote end part of the selection line of a memory array as viewed from the driving circuit of this selection line, whereby a direct current can be prevented from flowing through the level detecting MOSFET. This bring forth the effect that the level detector circuit can have a very low power consumption.

(2) A charging-up and/or discharging MOSFET formed of a single MOSFET is disposed at the remote end part of the selection line which is rendered selected and/or unselected by the output of the level detector circuit, thereby to bring forth the effect that the rise and/or fall of the level of the selection line can be rendered high in speed by the addition of the MOSFET of comparatively small size.

(3) The level detector circuit can quickly bring charging-up and discharging MOSFETs for auxiliary drive into the "on" states at the time of the mutual switching between a selected state and an unselected state, owing to the switching MOSFETs which are complementarily operated according to the timing signal of this level detector circuit. This brings forth the effect that, since no direct current flows through these MOSFETs for the auxiliary drive and the selection line as well as the driving circuit thereof, a low power consumption can be realized.

(4) Since the MOSFET for the auxiliary drive of the selection line can be formed of a single MOSFET, the area occupied by an auxiliary driving circuit including the level detector circuit can be made small. This means a high density of integration of the memory array can be realized.

While, in the above, the invention made by the inventors has been concretely described on the basis of embodiments, it is needless to say that this invention is not restricted to the foregoing embodiments. On the contrary, it can be variously altered within a scope not departing from the purport thereof. By way of example, in such a case where the fall of the level of word line affects the shortening of an access time, the MOSFET Q7 in FIG. 3 may well be omitted. In such a case where the operation of selecting data lines is slowed down due to the coupling of a large number of column switching MOSFETs for the data line selection, also column selection lines may well be provided at the remote end parts thereof with auxiliary driving circuits similar to the foregoing.

Besides, the practicable arrangements of an address decoder and a word line driving circuit can take various aspects of performance. The timing signal to be supplied to the auxiliary driving circuit need not be exactly the same signal as the timing signal of the word line driving circuit. Instead, it may be another timing signal which is generated substantially at the same timing as the word line driving circuit timing signal.

In the above, the invention made by the inventors has been described as to the case of applying it to a microprogram ROM which forms the background thereof. However, the invention is not restricted to this case, but it can be extensively utilized for semiconductor memories such as dynamic RAMs (random access memories), static RAMs, and various programmable ROMs to be electrically written in.

We claim:

1. A microprocessor comprising a microprogram ROM, wherein said microprogram ROM comprises:
   a memory array which has a plurality of memory cells and a plurality of selection lines coupled to said memory cells;
   a driver circuit whose output terminal is coupled to one end of each selection line for selecting predetermined memory cells by providing an output signal to a predetermined selection line;
   a voltage detector circuit constructed of a first MOSFET whose gate receives an output signal of said driver circuit through said predetermined selection line, an output node coupled in series with the source-drain path of the first MOSFET, a second MOSFET which is on/off-controlled by a timing signal, wherein said first and second MOSFETs are connected in series between the output node and one terminal of a power source, and a third MOSFET which is on/off-controlled complementarily to said second MOSFET and which is connected between another terminal of the power source and the output node; and a fourth MOSFET which is interposed between said another terminal of the power source and the gate of said first MOSFET, and which is brought into an "on" state by an output of the output node at a predetermined time when said second MOSFET has been brought into an "on" state and when a gate potential of said first MOSFET has exceeded a predetermined level, wherein said microprogram ROM is formed on a single semiconductor substrate with other elements of said microprocessor, including registers, an arithmetic circuit and a timing control circuit.

2. A microprocessor according to claim 1, wherein said first and second MOSFETs are of a first conductivity type, and said third and fourth MOSFETs are of a second conductivity type opposite to said first conductivity type.

3. A microprocessor according to claim 2, wherein said memory array is constructed of said plurality of memory cells, word lines to which selection terminals of said memory cells are coupled, and data lines to which data terminals of said memory cells are coupled, and wherein said selection lines are said word lines.

4. A microprocessor according to claim 3, wherein said each word line is made of a polycrystalline silicon layer.

5. A microprocessor according to claim 1, wherein said driver circuit is formed of a dynamic circuit which is operated in synchronism with a timing at which said second MOSFET is brought into the "on" state.

6. A microprocessor according to claim 5, further comprising a word line resetting MOSFET which is interposed between an output of said driver circuit and said one terminal of the power source.

7. A microprocessor according to claim 2, further comprising a fifth MOSFET of said first conductivity type which is interposed between the gate of said first MOSFET and said one terminal of the power source and which is controlled by a potential arising at a common node between said first MOSFET and said second MOSFET, wherein said first MOSFET has its drain coupled to the output node, while said second MOSFET has its drain coupled to a source of said first MOSFET and to a gate of said fifth MOSFET.

8. A microprocessor according to claim 1, wherein said first MOSFET has its drain coupled to the output node and its source coupled to the drain of the second MOSFET.

9. A microprocessor according to claim 1, wherein said one terminal of a power source is ground.

* * * * *